(12) United States Patent
Brunet et al.

(10) Patent No.: US 8,896,327 B2
(45) Date of Patent: Nov. 25, 2014

(54) CURRENT MIRROR SELF-CAPACITANCE MEASUREMENT

(75) Inventors: Samuel Brunet, Cowes (GB); Luben Hristov Hristov, Sofia (BG); Trond Jarle Pedersen, Trondheim (NO); Iqbal Sharif, Hampshire (GB)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/445,748

(22) Filed: Apr. 12, 2012

(65) Prior Publication Data

US 2013/0271163 A1   Oct. 17, 2013

(51) Int. Cl.
*G01R 27/26* (2006.01)

(52) U.S. Cl.
USPC ........................................................ 324/679

(58) Field of Classification Search
USPC ................... 178/18.06, 19.03; 324/658, 663, 324/676–679, 686–688; 327/337; 341/33; 345/173, 174
See application file for complete search history.

(56) References Cited

U.S. PATENT DOCUMENTS

| | | | |
|---|---|---|---|
| 7,663,607 B2 | 2/2010 | Hotelling | |
| 7,746,257 B2 * | 6/2010 | Schneider et al. | 341/143 |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,154,310 B1 * | 4/2012 | Maharyta et al. | 324/686 |
| 8,179,381 B2 | 5/2012 | Frey | |
| 2008/0142281 A1 * | 6/2008 | Geaghan | 178/18.06 |
| 2009/0315854 A1 | 12/2009 | Matsuo | |
| 2010/0045310 A1 * | 2/2010 | Betancourt | 324/686 |
| 2011/0148440 A1 * | 6/2011 | Bruwer et al. | 324/684 |
| 2012/0043971 A1 * | 2/2012 | Maharyta | 324/658 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |

FOREIGN PATENT DOCUMENTS

WO   WO 2012/129247   9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Melissa Koval
*Assistant Examiner* — Daniel Miller
(74) *Attorney, Agent, or Firm* — Baker Botts LLP

(57) ABSTRACT

In one embodiment, a method includes applying a first current to a capacitance of a touch sensor. The application of the first current to the capacitance for a first amount of time modifies the voltage at the capacitance from the reference voltage level to a first pre-determined voltage level. The method also includes applying a second current to an integration capacitor. The second current is proportional to the first current. The application of the second current to the integration capacitor for the first amount of time modifies the voltage at the integration capacitor from the reference voltage level to a first charging voltage level. The method also includes determining whether a touch input to the touch sensor has occurred based on the first charging voltage level.

17 Claims, 8 Drawing Sheets

CURRENT MIRROR SELF-CAPACITANCE MEASUREMENT

TECHNICAL FIELD

The disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
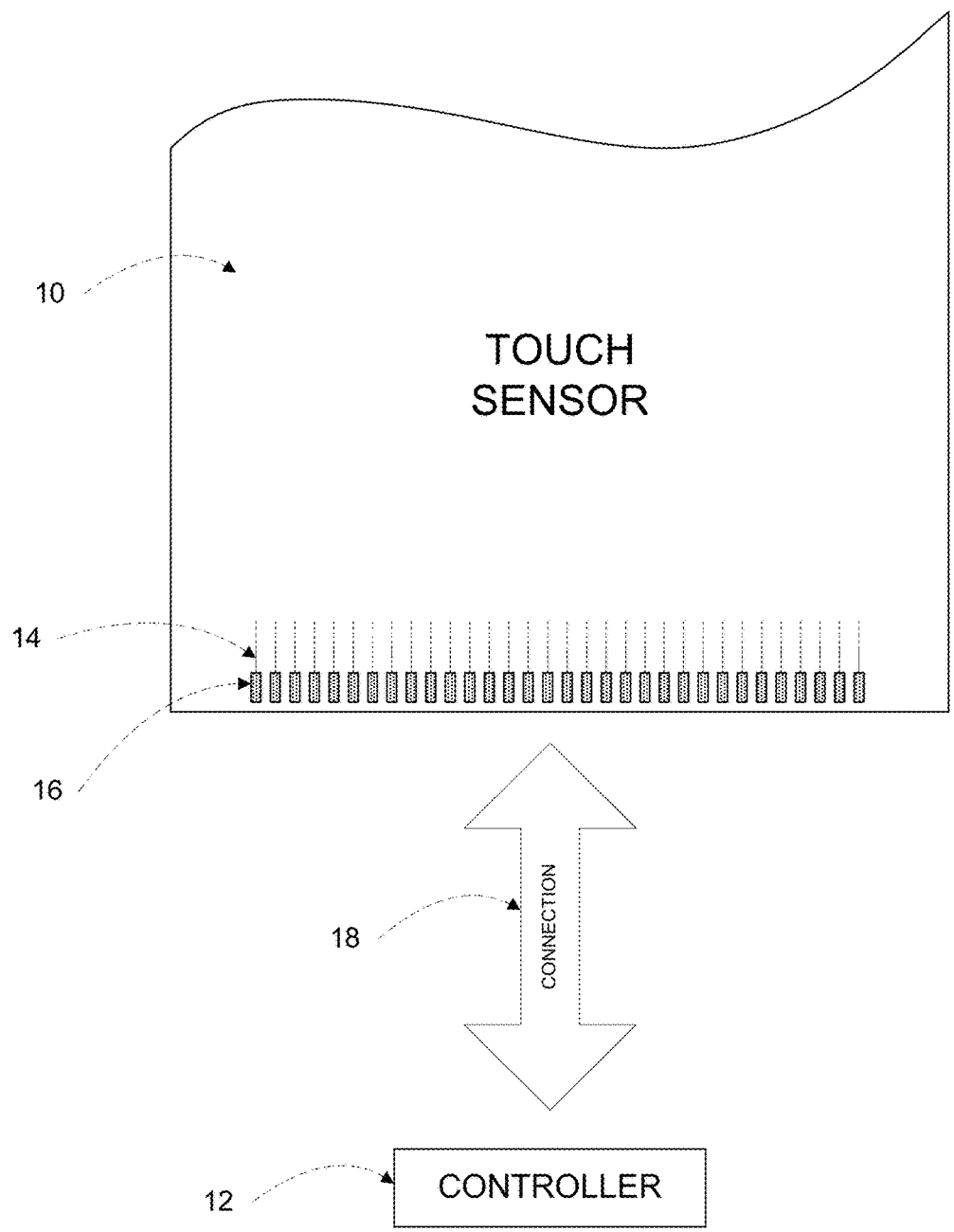
FIG. 1 illustrates an example touch sensor with an example touch-sensor controller.

FIG. 1 illustrates an example touch sensor with an example touch-sensor controller. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 microns ($\mu$m) or less and a width of approximately 10 $\mu$m or less. As another example, one or more portions of the conductive material may be silver or silver-based and similarly have a thickness of approximately 5 $\mu$m or less and a width of approximately 10 $\mu$m or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
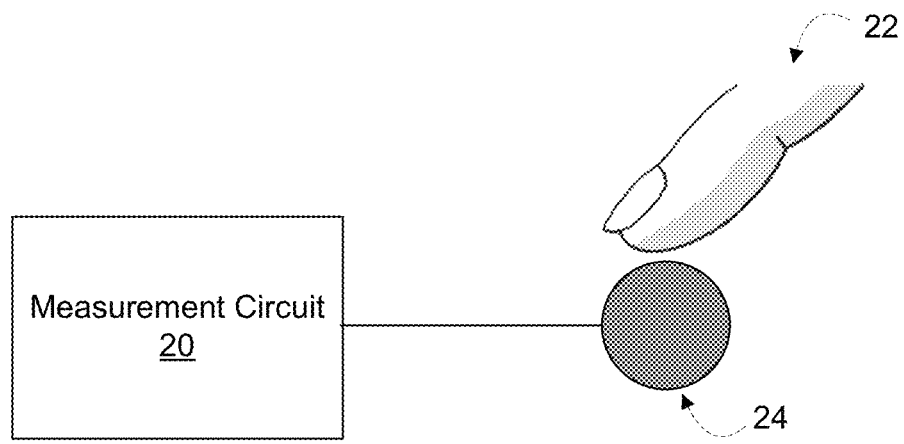
FIGS. 2A-B illustrate an example schematic of an example self-capacitance measurement.
Figure 2B:
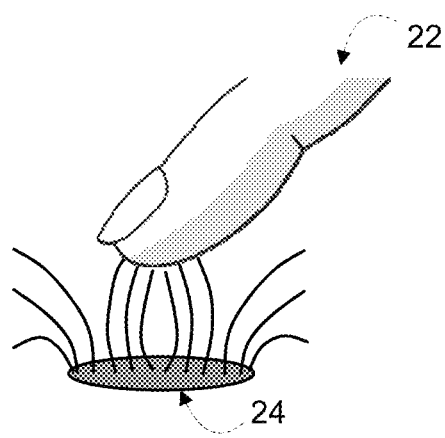

FIGS. 2A-B illustrate a schematic of an example self-capacitance measurement. In the example of FIG. 2A, an electrode 24 of the touch sensor is coupled to a measurement circuit 20. As described below, electrode 24 forms a capacitance to ground that is distributed in the space. In particular embodiments, the capacitance to ground may include multiple elements, such as for example, capacitance of the tracks in the silicon, tracks on the printed circuit board (PCB), electrodes 24 made from conductive material (ITO, copper mesh, etc.), or an object providing a touch input. Electrode 24 has capacitive coupling to ground through the surrounding objects that are galvanically or capacitively connected to ground. As described above, measurement circuit 20 of the touch-sensor controller transmits a drive signal and senses a signal indicative of a touch or proximity input, from for example a finger 22, through electrode 24. In particular embodiments, measurement circuit 20 of the touch-sensor controller generates the drive signal transmitted by electrode 24 and senses the capacitance to ground. The capacitance of the surrounding material includes at least in part, the capacitance between electrode 24 and ground with finger 22 providing the touch or proximity input. As an example and not by way of limitation, the capacitance provided by finger 22 providing the touch or proximity input may add 5-10% of the capacitance sensed by electrode 24.

In the example of FIG. 2B, the drive signal transmitted by electrode 24 generates an electric field that emanates from electrode 24 to a signal ground of the touch sensor. The signal ground is galvanically or capacitively coupled to ground. The presence of finger 22 effects the electric field and in turn the amount of charge sensed at electrode 24 by measurement circuit 20. As finger 22 approaches electrode 24, the capacitance between electrode 24 and ground detected by the measurement circuit 20 increases. Although this disclosure describes the measurement circuit being integrated with a touch-sensor controller, this disclosure contemplates a measurement circuit being a discrete circuit or part of any suitable circuit.

Figure 3:
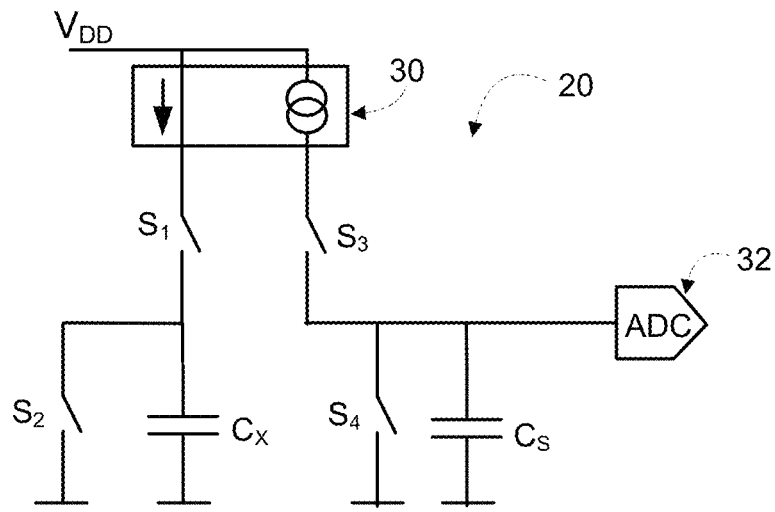
FIG. 3 illustrates an example circuit schematic for self-capacitance measurements.

FIG. 3 illustrates an example circuit schematic for self-capacitance measurements. Self-capacitance measurement circuit 20 determines a change of a touch sensor capacitance schematically illustrated in the example of FIG. 3 by measurement capacitance $C_X$. In particular embodiments, measurement capacitance $C_X$ may be formed in part between an electrode of the touch sensor and a touch object, e.g. finger, capacitively or galvanically coupled to ground. As an example and not by way of limitation, the conductive material of the touch sensor may include portions of tracks, pins, or internal network of the touch sensor. As described above, the electrode of the touch sensor senses the capacitance between the electrode and ground with the finger providing the touch or proximity input through the electric field transmitted by the electrode.

The portion of measurement capacitance $C_X$ that includes at least a portion of the electrode is coupled to an input of a current mirror 30 or ground through switches $S_1$ and $S_2$, respectively. In other particular embodiments, switch $S_2$ may be coupled to a voltage other than ground. Current mirror 30 is a four-terminal circuit that generates, at an output node that functions as an adjustable current source, an in-flowing or out-flowing current that is a proportional to a current flowing into or out of an input node that functions as a current-sensing module. The output of current mirror 30 that functions as a current-sensing module is coupled to integration capacitor $C_S$ through switch $S_3$. The input of current mirror 30 that functions as a current-sensing module senses the current applied to measurement capacitance $C_X$ through the output of the current-sensing module of current mirror 30. A current proportional to the current sensed at the current-sensing input of current mirror 30 is applied to integration capacitor $C_S$ from the input of adjustable-current source through the current-source output of current mirror 30. As an example and not by way of limitation, a ratio of current applied to measurement capacitance $C_X$ to current applied to integration capacitor $C_S$ is substantially N:1, where N may be a value different than 1. The voltage at integration capacitor $C_S$ is an input to analog-to-digital converter (ADC) 32. Although this disclosure describes and illustrates a particular arrangement of particular components for the self-capacitance measurement circuit, this disclosure contemplates any suitable arrangement of any suitable components for the self-capacitance measurement circuit, such as for example, current sources in place of current mirrors. Moreover, this disclosure contemplates applying any suitable currents to the measurement capacitance and integration capacitor, such as for example, fixed current, limited current, or current with any suitable relationship between the current applied to the measurement capacitance and the current applied to the integration capacitor.

Figure 4A:
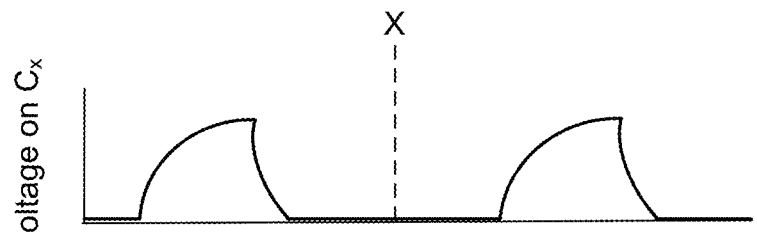
FIGS. 4A-D illustrate example waveforms for example self-capacitance measurements.
Figure 4B:
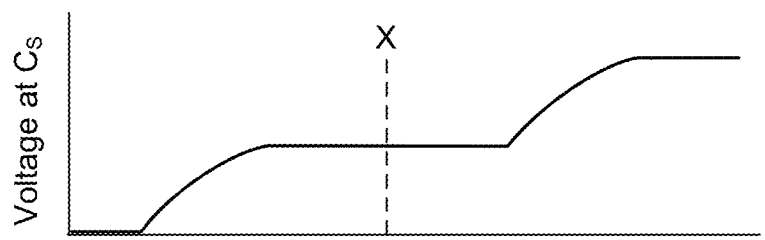

FIGS. 4A-D illustrate example waveforms for measurement capacitance and integration capacitor over time for example self-capacitance measurements. FIGS. 4A-D illustrate two sequential charge cycles or bursts for accumulating charge on integration capacitor $C_S$ when the self-capacitance measurement circuit is operating in a burst mode, as described below. The timing diagram of a single charge transfer is illustrated in FIGS. 4A-D on the left of line X. As described above, a touch or proximity input on the electrode of the touch sensor effects the amount of charge, and in turn the voltage, at measurement capacitance $C_X$. In the example of FIG. 4A, charge of measurement capacitance $C_X$ is modified resulting in the voltage at measurement capacitance $C_X$ being a reference voltage level. As an example and not by way of limitation, the reference voltage level may be ground. In particular embodiments, measurement capacitance $C_X$ is coupled to ground through switch $S_2$, as illustrated in FIG. 3. In the example of FIG. 4B, the amount of charge of integration capacitor $C_S$ is modified resulting in the voltage at integration capacitor $C_S$ being ground. In particular embodiments, integration capacitor $C_S$ is coupled to ground through switch $S_4$, as illustrated in the example FIG. 3.

Figure 4C:
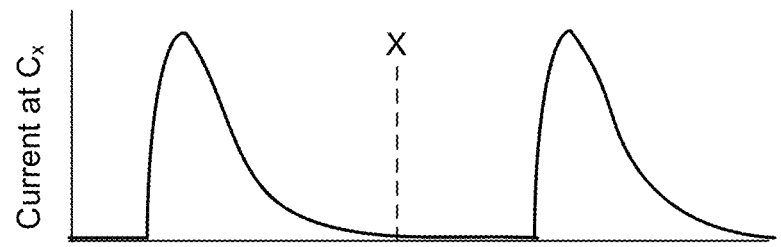

In the example of FIG. 4C, after setting measurement capacitance $C_X$ and integration capacitor $C_S$ to the reference voltage level, current is applied to measurement capacitance $C_X$. The application of current to measurement capacitance $C_X$ modifies the voltage at measurement capacitance $C_X$ from the reference voltage level to a pre-determined voltage level, as illustrated in the example of FIG. 4A. As an example and not by way of limitation, the reference voltage level at measurement capacitance $C_X$ is ground and the pre-determined voltage level is $V_{DD}$ minus a voltage drop of the current mirror. As another example, the applied current substantially completely charges measurement capacitance $C_X$. In particular embodiments, current is applied to measurement capacitance $C_X$ by coupling measurement capacitance $C_X$ to a voltage source and sensed by the current-sensing input of the current mirror 30 to substantially completely charge measurement capacitance $C_X$, as illustrated in the example of FIG. 3.

The charging of measurement capacitance $C_X$ through the current-sensing module of current mirror 30 results in charging of integration capacitor $C_S$ with current proportional to the amount of charge applied to measurement capacitance $C_X$. Charging of integration capacitor $C_S$ continues until the voltage on Cx is substantially equal to the pre-determined voltage level, as illustrated in left of line X of FIG. 4D. As an example and not by way of limitation, measurement capacitance $C_X$ may be charged to the supply voltage of the touch sensor or some other voltage. In particular embodiments, the current applied to integration capacitor $C_S$ is proportional to the current applied to measurement capacitance $C_X$. As an example and not by way of limitation, the current applied to integration capacitor $C_S$ is lower than the current applied to measurement capacitance $C_X$.

The applied current modifies the voltage at integration capacitor $C_S$ from the reference voltage level to a charging voltage level, as illustrated to the left of line X of FIG. 4B. The charging voltage level at integration capacitor $C_S$ depends in part on whether a touch or proximity input occurs at the electrode of the touch sensor. As described above, a touch or proximity input at the electrode of the touch sensor increases the measured capacitance of measurement capacitance $C_X$. The increase in the measured capacitance of measurement capacitance $C_X$ increases the amount of charge applied to measurement capacitance $C_X$ and, in turn, integration capacitor $C_S$, thereby effecting the charging voltage level at integration capacitor $C_S$. In particular embodiments, current is applied to integration capacitor $C_S$ while current is applied to measurement capacitance $C_X$ and sensed by the current-sensing input of the current mirror, as illustrated in the example of FIGS. 4A-B. As an example and not by way of limitation, current is applied to measurement capacitance $C_X$ for a time longer than the resistor-capacitor (RC) time constant of the electrodes.

In the example of FIG. 4C, after the application of current, the voltage at measurement capacitance $C_X$ is modified from the pre-determined voltage level to the reference voltage level. In the example of FIG. 3, the self-capacitance measurement circuit discharges charge of measurement capacitance $C_X$ by coupling measurement capacitance $C_X$ to ground. In particular embodiments, the difference between the reference voltage level to a charging voltage level at integration capacitor $C_S$ is measured by the ADC and a determination of a whether a touch or proximity input has occurred may be based on the difference.

Figure 4D:
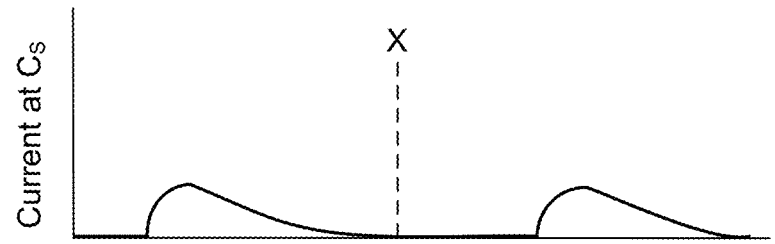

In particular embodiments, the self-capacitance circuit may be operated in burst mode. In the burst mode, charging integration capacitor $C_S$ while charging and discharging of measurement capacitance $C_X$ is performed multiple times. In the example of FIG. 4D, each charging cycle, i.e. charging and discharging, of measurement capacitance $C_X$ applies current to integration capacitor $C_S$. In the example of FIG. 4B, each application of charge on integration capacitor $C_S$ increases the voltage at integration capacitor $C_S$. In particular embodiments, measurement capacitance $C_X$ may be charged for number of times until the voltage at integration capacitor $C_S$ is substantially equal to a pre-determined threshold voltage level. In this case, the number of charge cycles of measurement capacitance $C_X$ may be the signal used to determined whether a touch or proximity input has occurred at the electrode.

TABLE 1 illustrates an example sequence of operations for the example self-capacitance measurement illustrated in FIGS. 4A-D. Step 3 applies current to measurement capacitance $C_X$ and integration capacitor $C_S$ that modifies the voltage at integration capacitor $C_S$ to the charging voltage level. As described above, the charging voltage level of integration capacitor $C_S$ depends in part on whether a touch or proximity input is present on the electrode of the touch sensor. Steps 5-6 measure the charging voltage level of integration capacitor $C_S$ and discharges measurement capacitance $C_X$, as described above. In particular embodiments, measurement capacitance $C_X$ is discharged by closing switch $S_2$. In other particular embodiments, steps 2-5 are performed a number of times corresponding to a burst length. Repetition of applying current on measurement capacitance $C_X$ and integration capacitor $C_S$ increases the voltage at integration capacitor $C_S$. Although this disclosure describes and illustrates a particular sequence of steps in TABLE 1, this disclosure contemplates any suitable sequence of steps for performing self-capacitance measurements.

TABLE 1

| Step | $S_1$ | $S_2$ | $S_3$ | $S_4$ | Description |
|---|---|---|---|---|---|
| 1 | off | on | off | on | Initial discharge state — all capacitors fully discharged |
| 2 | on | off | off | off | Floating state |
| 3 | on | off | on | off | Apply current to measurement capacitance $C_X$ and integration capacitor $C_S$ |
| 4 | off | off | off | off | Disconnect current source when measurement capacitance $C_X$ is substantially completely charged |
| 5 | off | on | off | off | Discharge measurement capacitance $C_X$ |
| 6 | off | off | off | off | Measure voltage on integration capacitor $C_S$ with ADC |

Figure 5:
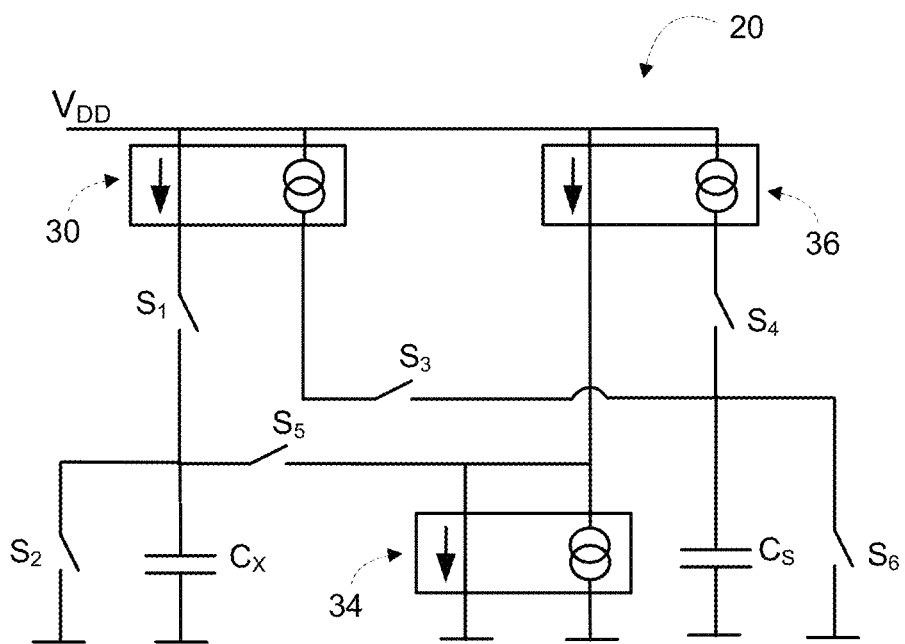
FIG. 5 illustrates an example circuit schematic for self-capacitance measurements with low-frequency (LF) noise suppression.

FIG. 5 illustrates an example circuit schematic for self-capacitance measurements with LF noise suppression. Self-capacitance measurement circuit 20 determines a change of a touch sensor capacitance schematically illustrated in the example of FIG. 5 by measurement capacitance $C_X$. As described above, measurement capacitance $C_X$ may be formed in part between an electrode of the touch sensor and touch objects capacitively or galvanically coupled to ground. The portion of measurement capacitance $C_X$ that includes the electrode is coupled to the current-sensing module of current mirror 30 or ground through switches $S_1$ and $S_2$, respectively. Measurement capacitance $C_X$ is coupled to the current-sensing module of current mirror 34 though switch $S_5$. The adjustable-current source of current mirror 34 is coupled to the current-sensing module of current mirror 36.

The current-source output of current mirror 30 and current mirror 36 applies current to integration capacitor $C_S$ through switches $S_3$ and $S_4$, respectively. In particular embodiments, current applied to integration capacitor $C_S$ by the current-source output of current mirror 30 is proportional to the current applied to measurement capacitance $C_X$ and sensed by the current-sensing input of current mirror 30. In other particular embodiments, current applied to integration capacitor $C_S$ by the current-source output of current mirror 36 is proportional to the current applied to measurement capacitance $C_X$ and sensed by the current-sensing input of current mirror 34. As an example and not by way of limitation, the current-source output of current mirror 36 applies current to integration capacitor $C_S$ at a ratio of current applied to measurement capacitance $C_X$ and sensed by the current-sensing input of current mirror 34. As another example, a ratio of current applied to measurement capacitance $C_X$ to current applied to integration capacitor $C_S$ is substantially N:1, where N is a value different than 1. Integration capacitor $C_S$ is coupled to ground through switch $S_6$. Although this disclosure describes and illustrates a particular arrangement of particular components for the self-capacitance measurement circuit, this disclosure contemplates any suitable arrangement of any suitable components for the self-capacitance measurement circuit.

Figure 6A:
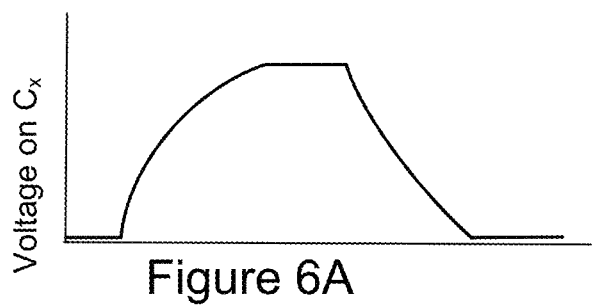
FIGS. 6A-D illustrate example waveforms for an example self-capacitance measurement with LF noise suppression.
Figure 6B:
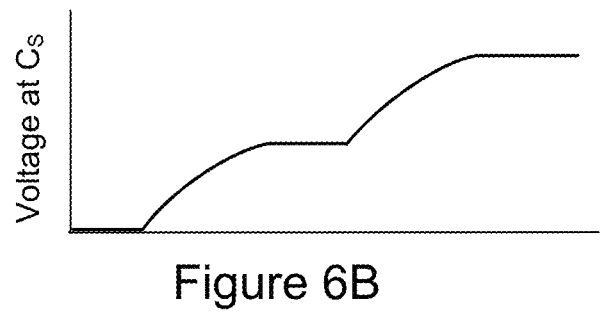

FIGS. 6A-D illustrate example waveforms of the measurement capacitance and integration capacitor over time for an example self-capacitance measurement with LF noise suppression. FIGS. 6A-D illustrate sequential charge cycles or bursts for accumulating charge on integration capacitor $C_S$ when the self-capacitance measurement circuit is operating in a burst mode, as described below. As described above, a touch or proximity input on the electrode of the touch sensor effects the amount of charge, and in turn the voltage, at measurement capacitance $C_X$. In the example of FIG. 6A, charge of measurement capacitance $C_X$ is modified resulting in the voltage at measurement capacitance $C_X$ being a reference voltage level. As an example and not by way of limitation, the reference voltage level may be ground. In particular embodiments, measurement capacitance $C_X$ is coupled to ground through switch $S_2$, as illustrated in FIG. 5. In the example of FIG. 6B, the amount of charge of integration capacitor $C_S$ is modified resulting in the voltage at integration capacitor $C_S$ being ground. In particular embodiments, integration capacitor $C_S$ is coupled to ground through switch $S_6$, as illustrated in the example of FIG. 5.

Figure 6C:
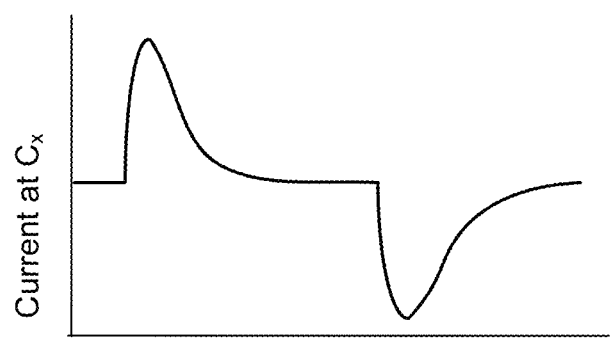

In the example of FIG. 6C, after setting measurement capacitance $C_X$ and integration capacitor $C_S$ to the reference voltage level, current is applied to measurement capacitance $C_X$. The application of current modifies the voltage at measurement capacitance $C_X$ from the reference voltage level to a pre-determined voltage level, as illustrated in the example of FIG. 6A. As an example and not by way of limitation, the reference voltage level at measurement capacitance $C_X$ is ground and the pre-determined voltage level is $V_{DD}$ minus a voltage drop of the current mirror. As another example, the amount of charge applied to measurement capacitance $C_X$ substantially completely charges the capacitance of measurement capacitance $C_X$. In particular embodiments, current is applied to measurement capacitance $C_X$ by coupling measurement capacitance $C_X$ to a voltage source through the current-sensing input of the current mirror 30 to substantially completely charge measurement capacitance $C_X$, as illustrated in the example of FIG. 5.

Figure 6D:
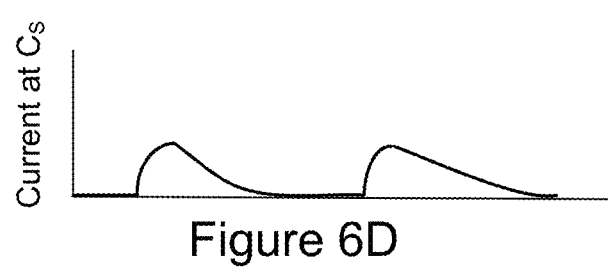

The application of current to measurement capacitance $C_X$ also applies current to integration capacitor $C_S$ while current is applied to measurement capacitance $C_X$, as illustrated in the example of FIG. 6D. In particular embodiments, the current applied to integration capacitor $C_S$ is proportional to the current applied to measurement capacitance $C_X$. As an example and not by way of limitation, the current applied to integration capacitor $C_S$ is lower than the current applied to measurement capacitance $C_X$. The application of current to integration capacitor $C_S$ modifies the voltage at integration capacitor $C_S$ from the reference voltage level to a charging voltage level, as illustrated in the example of FIG. 6B. The charging voltage level at integration capacitor $C_S$ depends in part on whether a touch or proximity input occurs at the electrode of the touch sensor. As described above, a touch or proximity input at the electrode of the touch sensor increases measurement capacitance $C_X$. The increase in measurement capacitance $C_X$ increases the amount of charge applied to measurement capacitance $C_X$ and integration capacitor $C_S$, thereby effecting the charging voltage level. In particular embodiments, current is applied to measurement capacitance $C_X$ by coupling measurement capacitance $C_X$ to the voltage source through the current-sensing input of the current mirror 30 until the capacitance of measurement capacitance $C_X$ is substantially fully charged, as illustrated in the example of FIG. 5.

In the example of FIG. 6A, after the application of current, the voltage at measurement capacitance $C_X$ is modified from the pre-determined voltage level to the reference voltage level. In the example of FIG. 5, the self-capacitance measurement circuit applies current to measurement capacitance $C_X$ and sensed through the current-sensing input of current mirror 34. In the example of FIG. 6C, current sensed by the current-sensing input of current mirror 34 is in the opposite direction, relative to measurement capacitance $C_X$, compared to current sensed by the current-sensing input of current mirror 30. As an example and not by way of limitation, current sensed by the current-sensing input of current mirror 30 charges measurement capacitance $C_X$ and current sensed by the current-sensing input of current mirror 34 discharges measurement capacitance $C_X$. In the example of FIG. 6D, the application of current to measurement capacitance $C_X$ results in the application of current to integration capacitor $C_S$. The application of current to integration capacitor $C_S$ through current mirror 36 modifies the voltage at integration capacitor $C_S$ from the reference voltage level to a second charging voltage level, as illustrated in the example of FIG. 6B. As an example and not by way of limitation, a ratio of current applied to measurement capacitance $C_X$ through current mirror 34 to current applied to integration capacitor $C_S$ through current mirror 36 is substantially N:1, where N is a value different than 1. As another example, the current sensed by the current-sensing input of current mirror 36 is substantially equal to the current of the current-source output of current mirror 36.

LF noise may corrupt the input detected through the electrode of the touch sensor. As an example and not by way of limitation, LF noise may originate from active main lines of the touch sensor operating at 50-60 Hz. As another example, LF noise may have a large amplitude, such as for example, of 100 volts or more. During a transfer of charge, a LF noise source may inject an amount of charge on measurement capacitance $C_X$. Depending on whether on the LF noise is positioned on the falling or rising slope of the LF waveform, the injected charge adds or subtracts charge into measurement capacitance $C_X$ as an offset to the modification of charge of measurement capacitance $C_X$ performed by the measurement circuit. In the case when sequential measurements are performed, the charge added or subtracted by the LF noise source appears as common-mode shift of the signals from measurement capacitance $C_X$. Depending on the measurement frequency, the common-mode shift may modify the amplitude or polarity of signals from measurement capacitance $C_X$.

LF noise present at charging and discharging of measurement capacitance $C_X$ is observed as a common-mode offset in the signal of both applications of current. For measurements performed within a relatively short period of time, the induced LF noise has substantially the same polarity and amplitude for each application of current. Common-mode offsets may have a frequency that is lower than a measurement frequency and cause signal fluctuation. As described above, the noise offset of the differential self-capacitance measurement is suppressed by inverting the direction of the current, i.e. charging and discharging, applied to measurement capacitance $C_X$, thereby subtracting the LF noise induced on measurement capacitance $C_X$. The measured voltage at integration capacitor $C_S$ is substantially free of the LF noise induced at measurement capacitance $C_X$.

TABLE 2 illustrates an example sequence of operations for the example self-capacitance measurement illustrated in FIGS. 6A-D. Step 3 applies current to measurement capacitance $C_X$ and integration capacitor $C_S$ that modifies the voltage at integration capacitor $C_S$ to the charging voltage level. As described above, the charging voltage level depends in part on whether a touch or proximity input is present on the electrode of the touch sensor. Step 5 applies current to discharge measurement capacitance $C_X$ and further charge integration capacitor $C_S$ that modifies the voltage at integration capacitor $C_S$ to a second charging voltage level. Step 7 measures the voltage at integration capacitor $C_S$, as described above. In particular embodiments, steps 2-5 are performed a number of times corresponding to a burst length. As described above, repetition of applying current on measurement capacitance $C_X$ and integration capacitor $C_S$ increases the voltage at integration capacitor $C_S$. Although this disclosure describes and illustrates a particular sequence of steps in TABLE 2, this disclosure contemplates any suitable sequence of steps for performing self-capacitance measurements with LF noise suppression.

TABLE 2

| Step | $S_1$ | $S_2$ | $S_3$ | $S_4$ | $S_5$ | $S_6$ | Description |
| --- | --- | --- | --- | --- | --- | --- | --- |
| 1 | off | on | off | off | off | on | Initial discharge measurement capacitance $C_X$ and integration capacitor $C_S$ |
| 2 | off | off | off | off | off | off | Floating state |
| 3 | on | off | on | off | off | off | Apply current to measurement capacitance $C_X$ and integration capacitor $C_S$ |
| 4 | off | off | off | off | on | off | Disconnect current source when measurement capacitance $C_X$ is substantially completely charged |
| 5 | off | off | off | on | on | off | Apply current of measurement capacitance $C_X$ and integration capacitor $C_S$ resulting in discharge of measurement capacitance $C_X$ |
| 6 | off | off | off | off | off | off | Measure voltage on integration capacitor $C_S$ |
| 7 | off | on | off | on | off | on | Discharge all capacitors |

Figure 7:
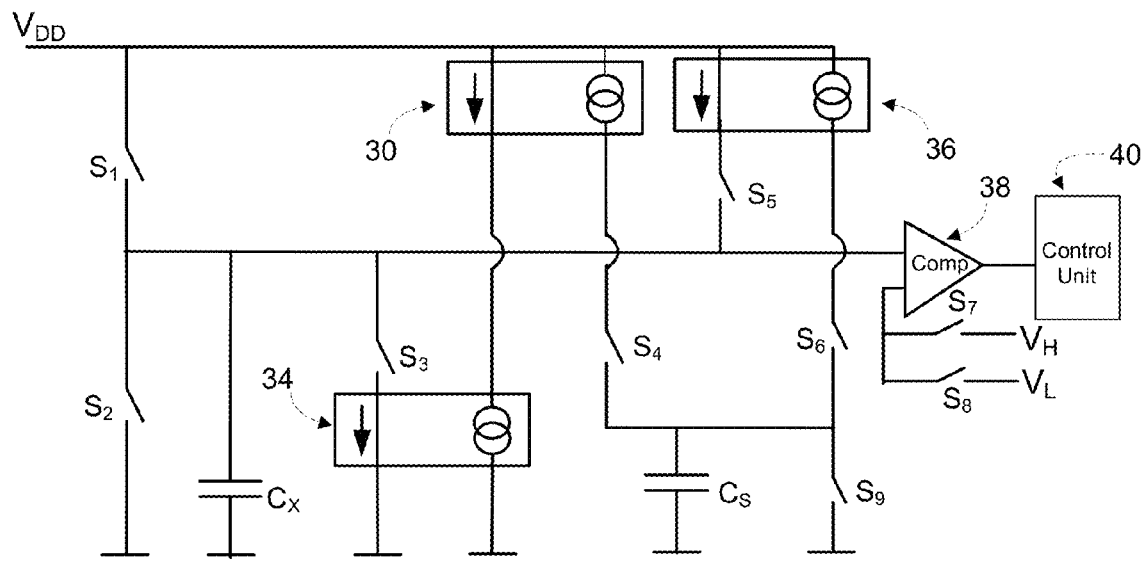
FIG. 7 illustrates another example circuit schematic for an example self-capacitance measurement.

FIG. 7 illustrates an example circuit schematic for an example voltage-limited self-capacitance measurement with LF noise suppression. Self-capacitance measurement circuit 20 determines a change of a touch sensor capacitance schematically illustrated in the example of FIG. 7 by measurement capacitance $C_X$. As described above, measurement capacitance $C_X$ may be formed in part between an electrode of the touch sensor and touch object capacitively or galvanically coupled to ground. The portion of measurement capacitance $C_X$ that includes the electrode is coupled to an input of current mirror 36 or ground through switches $S_5$ and $S_2$, respectively. Measurement capacitance $C_X$ is coupled to a current-sensing module of current mirror 34 and supply voltage $V_{DD}$ though switches $S_3$ and $S_1$, respectively. The voltage at measurement capacitance $C_X$ is an input to a comparator 38. Another input of comparator 38 is coupled to a voltage $V_H$ and a voltage $V_L$ through switches $S_7$ and $S_8$, respectively. The output of comparator 38 is coupled to a control unit 40. In particular embodiments, control unit 40 may be asynchronous, such that when the state of the output of comparator 38 flips, control unit 30 substantially immediately interrupts the current to integration capacitor $C_S$. An inconsistent delay between a comparator flip event and the interruption of current to integration capacitor $C_S$ may result in a corrupted signal.

The current-source output of current mirror 30 and current mirror 36 applies current to integration capacitor $C_S$ through switches $S_4$ and $S_6$, respectively. In particular embodiments, current applied to integration capacitor $C_S$ by the current-source output of current mirror 30 and current mirror 36 are proportional to the current applied to measurement capacitance $C_X$ through current sensed by the current-sensing input of current mirror 34 and current mirror 36, respectively. As an example and not by way of limitation, current mirror 30 and current mirror 36 may be configured to apply current to integration capacitor $C_S$ as a ratio of current applied to measurement capacitance $C_X$ sensed by the current-sensing input of current mirror 34 and current mirror 36, respectively. As another example, a ratio of currents applied to measurement capacitance $C_X$ to currents applied to integration capacitor $C_S$ is substantially N:1, where N is a value different than 1. Integration capacitor $C_S$ is coupled to ground through switch $S_9$. Although this disclosure describes and illustrates a particular arrangement of particular components for the self-capacitance measurement circuit, this disclosure contemplates any suitable arrangement of any suitable components for the self-capacitance measurement circuit.

Figure 8A:
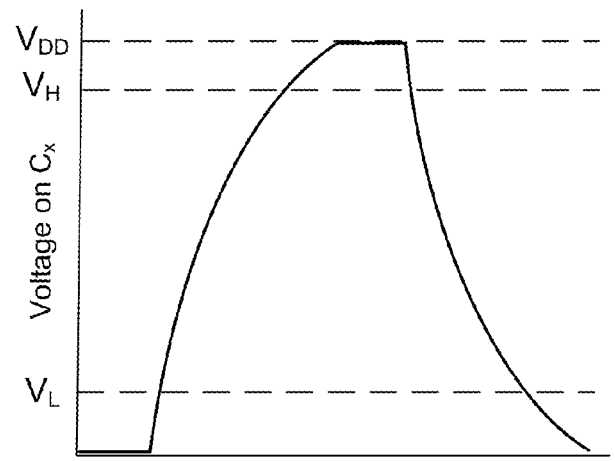
FIGS. 8A-B illustrate example waveforms for an example voltage-limited self-capacitance measurement with LF noise suppression.
Figure 8B:
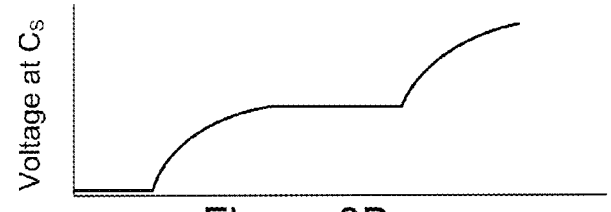

FIGS. 8A-B illustrate example waveforms of the measurement capacitance and integration capacitor over time for an example voltage-limited self-capacitance measurement with LF noise suppression. In the example of FIG. 8A, the amount of charge of measurement capacitance $C_X$ is modified resulting in the voltage at measurement capacitance $C_X$ being a reference voltage. As an example and not by way of limitation, the reference voltage may be ground. In particular embodiments, measurement capacitance $C_X$ is coupled to ground through switch $S_2$, as illustrated in FIG. 7. In the example of FIG. 8B, charge of integration capacitor $C_S$ is modified, resulting in the voltage at integration capacitor $C_S$ being ground. In particular embodiments, integration capacitor $C_S$ is coupled to ground through switch $S_9$, as illustrated in the example of FIG. 7.

After setting measurement capacitance $C_X$ and integration capacitor $C_S$ to the reference voltage level, current is applied to measurement capacitance $C_X$. The application of current to measurement capacitance $C_X$ modifies the voltage at measurement capacitance $C_X$ from the reference voltage level to a pre-determined voltage level, as illustrated in the example of FIG. 8A. As an example and not by way of limitation, the reference voltage level at measurement capacitance $C_X$ is ground and the pre-determined voltage level is $V_{DD}$ minus a voltage drop of the current mirror. As another example, the amount of charge applied to measurement capacitance $C_X$ substantially fully charges measurement capacitance $C_X$. In particular embodiments, current is applied by coupling measurement capacitance $C_X$ to a voltage source through the current-sensing input of the current mirror 36 to substantially fully charge measurement capacitance $C_X$, as illustrated in the example of FIG. 7.

Current is applied to integration capacitor $C_S$ while current is being applied to measurement capacitance $C_X$, and voltage $V_H$ is coupled to an input of the comparator. As the voltage at measurement capacitance $C_X$ is modified from the reference voltage level to substantially equal to voltage $V_H$, the output of the comparator switches state and the control unit interrupts the application of current to integration capacitor $C_S$.

The application of current to integration capacitor $C_S$ results in modifying the voltage at integration capacitor $C_S$ from the reference voltage level to a charging voltage level, as illustrated in the example of FIG. 6B. The charging voltage level of integration capacitor $C_S$ depends in part on whether a touch or proximity input occurs at the electrode of the touch sensor and the value of voltage $V_H$. In particular embodiments, the current applied to measurement capacitance $C_X$ is proportional to the current applied to integration capacitor $C_S$. In particular embodiments, current is applied to integration capacitor $C_S$ by coupling measurement capacitance $C_X$ to the voltage source through the current-sensing input of the current mirror 30, as illustrated in the example of FIG. 7. Current continues to be applied to measurement capacitance $C_X$ until measurement capacitance $C_X$ is substantially fully charged and the voltage at measurement capacitance $C_X$ is substantially equal to the pre-determined voltage level.

In the example of FIG. 8A, after the application of charge, the voltage at measurement capacitance $C_X$ is modified from the pre-determined voltage level to the reference voltage level. In the example of FIG. 7, the voltage-limited self-capacitance measurement circuit applies current to measurement capacitance $C_X$ that is sensed by the current-sensing input of current mirror 34. Current is applied to integration capacitor $C_S$ while current is being applied to measurement capacitance $C_X$ and voltage $V_L$ is coupled to an input of the comparator. The application of current to integration capacitor $C_S$ through the output of current mirror 36 results in modifying the voltage at integration capacitor $C_S$ from the reference voltage level to the first charging voltage level, as illustrated in the example of FIG. 8B.

As the voltage at measurement capacitance $C_X$ is modified from the pre-determined voltage level to substantially equal to voltage $V_L$, the output of the comparator switches state and the control unit interrupts the application of current to integration capacitor $C_S$. The application of current to integration capacitor $C_S$ through the current-source output of current mirror 30 results in modifying the voltage at integration capacitor $C_S$ from the first charging voltage level to a second charging voltage level, as illustrated in the example of FIG. 8B. Current continues to be applied to measurement capacitance $C_X$ until the voltage at measurement capacitance $C_X$ is substantially equal to the reference voltage level. Current sensed by the current-sensing input of current mirror 34 is in the opposite direction, relative to measurement capacitance $C_X$, compared to current sensed by the current-sensing input of current mirror 30. As an example and not by way of limitation, a ratio of currents applied to measurement capacitance $C_X$ to currents applied to integration capacitor $C_S$ are substantially N:1, where N is a value different than 1.

As described above, LF noise may corrupt the signal from measurement capacitance $C_X$. In the case when sequential measurements are performed, the added or subtracted charge from the LF noise source will appear as common-mode shift of the signals from measurement capacitance $C_X$. Depending on the measurement frequency, the common-mode shift may modify the amplitude or polarity of signals from measurement capacitance $C_X$. As described above, the noise offset of the differential self-capacitance measurement is suppressed by inverting the direction of the current, i.e. charging and discharging, applied to measurement capacitance $C_X$ and measuring the voltage at integration capacitor $C_S$.

TABLE 3 illustrates an example sequence of operations for the example voltage-limited self-capacitance measurement with LF noise suppression illustrated in FIGS. 8A-B. Steps 3-5 apply current to measurement capacitance $C_X$ and integration capacitor $C_S$ that modifies the voltage at measurement capacitance $C_X$ to the pre-determined voltage level and the voltage at integration capacitor $C_S$ to the charging voltage level. As described above, current to integration capacitor $C_S$ is interrupted when the voltage at measurement capacitance $C_X$ is substantially equal to voltage $V_H$. Steps 7-9 apply current to discharge measurement capacitance $C_X$ and further charge integration capacitor $C_S$, such that the voltage at measurement capacitance $C_X$ to the reference voltage level and the voltage at integration capacitor $C_S$ is a second charging voltage level. As described above, current to integration capacitor $C_S$ is interrupted when the voltage at measurement capacitance $C_X$ is substantially equal to voltage $V_L$. In particular embodiments, steps 2-9 are performed a number of times corresponding to a burst length. As described above, repetition of applying current on measurement capacitance $C_X$ and integration capacitor $C_S$ increases the voltage at integration capacitor $C_S$. Although this disclosure describes and illustrates a particular sequence of steps in TABLE 3, this disclosure contemplates any suitable sequence of steps for performing voltage-limited self-capacitance measurements with LF noise suppression.

integration capacitor $C_S$ is an input to a differential ADC 42. Another input to differential ADC 42 are voltage $V_{MAX}$ and voltage $V_{REF}$.

Differential ADC 42 is configured to perform analog-to-digital conversion on data within a range above a conversion threshold level. Differential ADC 42 compensates the effect of the constant capacitance component of measurement capacitance $C_X$ and reduces the required resolution of the differential ADC 42. As an example and not by way of limitation, setting an input of differential ADC 42 to a conversion threshold level, differential ADC 42 subtracts the conversion threshold level from the measured signal. In particular embodiments, the conversion threshold level is defined by voltage $V_{REF}$ and the range is defined by voltage $V_{MAX}$. By limiting a range that data is digitally converted, differential ADC 40 is able to increase the resolution of data within the limited range. In particular embodiments, the conversion threshold level may be set to a value corresponding to a touch value. As an example and not by way of limitation, a difference of the voltage at integration capacitor $C_S$ with a touch input may be 1.6 V, the conversion threshold level defined by

TABLE 3

| Step | $S_1$ | $S_2$ | $S_3$ | $S_4$ | $S_5$ | $S_6$ | $S_7$ | $S_8$ | $S_9$ | Description |
|---|---|---|---|---|---|---|---|---|---|---|
| 1 | off | on | off | off | off | off | on | off | on | Initial discharge state |
| 2 | off | off | off | off | off | off | on | off | off | Floating state |
| 3 | off | off | on | off | on | on | on | off | off | Apply current to measurement capacitance $C_X$ and integration capacitor $C_S$ |
| 4 | on | off | off | off | off | off | on | off | off | Voltage at measurement capacitance $C_X$ reaches $V_H$; and end current on integration capacitor $C_S$ |
| 5 | off | off | off | off | off | off | on | off | off | Measurement capacitance $C_X$ fully charged |
| 6 | off | off | off | off | off | off | off | on | off | Set comparator input to $V_L$ |
| 7 | off | off | on | on | off | off | on | off | off | Apply current to discharge measurement capacitance $C_X$ and charge integration capacitor $C_S$ |
| 8 | off | on | off | off | off | off | off | on | off | Voltage at measurement capacitance $C_X$ reaches $V_L$; and end current on integration capacitor $C_S$ |
| 9 | off | off | off | off | off | off | off | on | off | Discharging measurement capacitance $C_X$ complete; measure voltage at integration capacitor $C_S$ |

Figure 9:
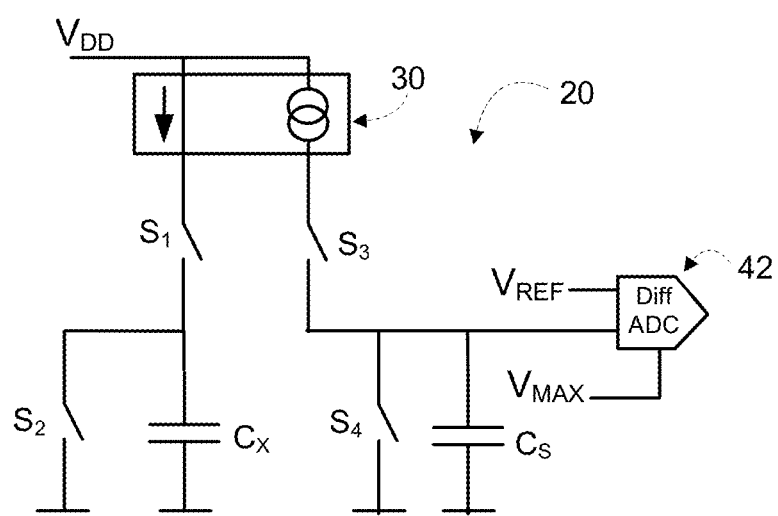
FIG. 9 illustrates another example circuit schematic for an example self-capacitance measurement.

FIG. 9 illustrates an example circuit schematic for self-capacitance measurements using a differential ADC. Self-capacitance measurement circuit 20 with differential ADC 42 determines a change of a touch sensor capacitance schematically illustrated in the example of FIG. 9 by measurement capacitance $C_X$. As described above, measurement capacitance $C_X$ may be formed in part between an electrode of the touch sensor and other surrounding conductive material of the touch sensor (not shown) capacitively or galvanically coupled to ground. The portion of measurement capacitance $C_X$ that includes the electrode is coupled to a current mirror 30 or ground through switches $S_1$ and $S_2$, respectively.

Integration capacitor $C_S$ is coupled to the current-source output of current mirror 30 and ground through switches $S_3$ and $S_4$, respectively. In particular embodiments, current applied to integration capacitor $C_S$ by the current-source output of current mirror 30 is proportional to the current applied to measurement capacitance $C_X$ and sensed by the current-sensing input of current mirror 30. As an example and not by way of limitation, current mirror 30 may be configured to apply current to integration capacitor $C_S$ as a ratio of current applied to measurement capacitance $C_X$. As another example, the ratio of current applied to measurement capacitance $C_X$ to current applied to integration capacitor $C_S$ is substantially N:1, where N is a value different than 1. The voltage at voltage $V_{REF}$ and the range is defined by voltage $V_{MAX}$, may be set to 1.5 V and 0.5 V, respectively. Although this disclosure describes and illustrates a particular arrangement of particular components for the self-capacitance measurement circuit using a differential ADC, this disclosure contemplates any suitable arrangement of any suitable components for the voltage-limited differential self-capacitance measurement circuit.

Figure 10:
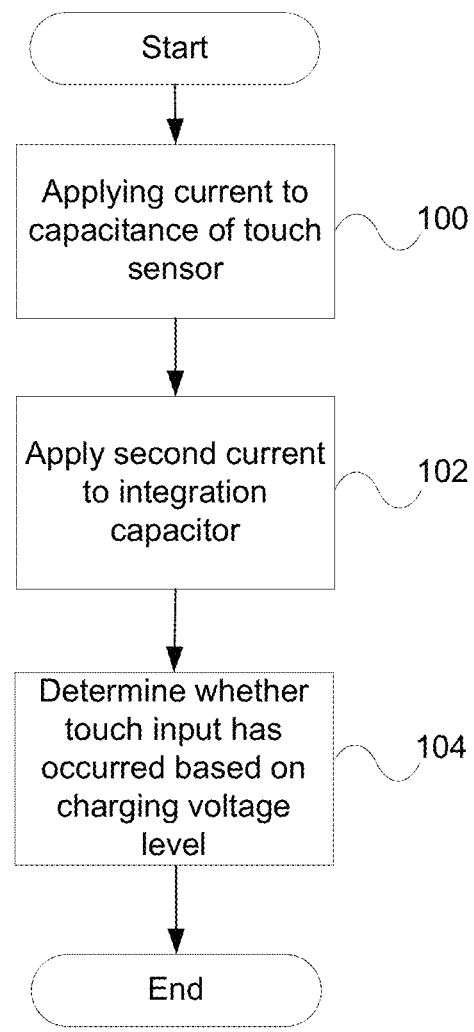
FIG. 10 illustrates an example method for performing self-capacitance measurements.

FIG. 10 illustrates an example method for performing self-capacitance measurements. The method may start at step 100, where a first current is applied to a capacitance of a touch sensor. The application of the first current to the capacitance for a first amount of time modifies the voltage at the capacitance from the reference voltage level to a first pre-determined voltage level. Step 102 applies a second current to an integration capacitor. The second current is proportional to the first current, and the application of the second current to the integration capacitor for the first amount of time modifies the voltage at the integration capacitor from the reference voltage level to a first charging voltage level. At step 104, whether a touch input to the touch sensor has occurred is determined based on the first charging voltage level, at which point the method may end. Although this disclosure describes and illustrates particular steps of the method of FIG. 10 as occurring in a particular order, this disclosure contemplates any suitable steps of the method of FIG. 10 occurring in any suitable order. Moreover, although this disclosure describes and illustrates particular components carrying out particular steps of the method of FIG. 10, this disclosure contemplates any suitable combination of any suitable components carrying out any suitable steps of the method of FIG. 10.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
   applying a first current to a capacitance of a touch sensor, the first current having a first magnitude, the first magnitude being the magnitude of the current actually applied to the capacitance, the application of the first current to the capacitance modifying a voltage at the capacitance from a reference voltage level to a first pre-determined voltage level;
   applying a second current to an integration capacitor, the second current being proportional to the first current, the application of the second current to the integration capacitor modifying a voltage at the integration capacitor from the reference voltage level to a first charging voltage level;
   applying a third current to the capacitance, the application of the third current to the capacitance modifying the voltage at the capacitance from the first pre-determined voltage level to the reference voltage level;
   applying a fourth current to the integration capacitor, the fourth current being proportional to the third current, the application of the fourth current to the integration capacitor modifying the voltage at the integration capacitor from the first charging voltage level to a second charging voltage level; and
   determining whether a touch input to the touch sensor has occurred based on the second charging voltage level.

2. The method of claim 1, wherein the third current has an opposite polarity to a polarity of the first current with respect to the capacitance.

3. The method of claim 1, further comprising:
   interrupting the application of the second current when the voltage at the capacitance is substantially equal to a first voltage limit, the first voltage level limit is lower than the first pre-determined voltage level; and
   interrupting the application of the fourth current when the voltage at the capacitance is substantially equal to a second voltage limit, the second voltage level limit is higher than a second pre-determined voltage level.

4. The method of claim 1, further comprising performing an analog-to-digital (ADC) conversion of the voltage at the integration capacitor when the voltage at the integration capacitor is higher than a conversion threshold level.

5. The method of claim 1, further comprising:
   discharging the capacitance of the touch sensor and applying the second current to a sampling capacitor a pre-determined number of times.

6. The method of claim 1, wherein the application of the first current saturates the capacitance of the touch sensor and application of the second current results in the integration capacitor being below a capacitor saturation level.

7. A computer-readable non-transitory storage medium embodying logic configured when executed to:
   apply a first current to a capacitance of a touch sensor, the first current having a first magnitude, the first magnitude being the magnitude of the current actually applied to the capacitance, the application of the first current to the capacitance modifying a voltage at the capacitance from a reference voltage level to a first pre-determined voltage level;
   apply a second current to an integration capacitor, the second current being proportional to the first current, the application of the second current to the integration capacitor modifying a voltage at the integration capacitor from the reference voltage level to a first charging voltage level;
   apply a third current to the capacitance, the application of the third current to the capacitance modifying the voltage at the capacitance from the first pre-determined voltage level to the reference voltage level;
   apply a fourth current to the integration capacitor, the fourth current being proportional to the third current, the application of the fourth current to the integration capacitor modifying the voltage at the integration capacitor from the first charging voltage level to a second charging voltage level; and
   determine whether a touch input to the touch sensor has occurred based on the second charging voltage level.

8. The medium of claim 7, wherein the third current has an opposite polarity to a polarity of the first current with respect to the capacitance.

9. The medium of claim 7, wherein the logic is further configured to:
   interrupt the application of the second current when the voltage at the capacitance is substantially equal to a first voltage limit, the first voltage level limit is lower than the first pre-determined voltage level; and
   interrupt the application of the fourth current when the voltage at the capacitance is substantially equal to a second voltage limit, the second voltage level limit is higher than a second pre-determined voltage level.

10. The medium of claim 7, wherein the logic is further configured to perform an analog-to-digital (ADC) conversion of the voltage at the integration capacitor when the voltage at the integration capacitor is higher than a conversion threshold level.

11. The medium of claim 7, wherein the logic is further configured to:
discharge the capacitance of the touch sensor and apply the second current to the integration capacitor a pre-determined number of times.

12. The medium of claim 7, wherein the application of the first current saturates the capacitance of the touch sensor and application of the second current results in the integration capacitor being below a capacitor saturation level.

13. A device comprising:
a measurement circuit; and
a computer-readable non-transitory storage medium coupled to the measurement circuit and embodying logic configured when executed to:
apply a first current to a capacitance of a touch sensor, the first current having a first magnitude, the first magnitude being the magnitude of the current actually applied to the capacitance, the application of the first current to the capacitance modifying a voltage at the capacitance from a reference voltage level to a first pre-determined voltage level;
apply a second current to an integration capacitor the second current being proportional to the first current, the application of the second current to the integration capacitor modifying a voltage at the integration capacitor from the reference voltage level to a first charging voltage level;
apply a third current to the capacitance, the application of the third current to the capacitance modifying the voltage at the capacitance from the first pre-determined voltage level to the reference voltage level;
apply a fourth current to the integration capacitor, the fourth current being proportional to the third current, the application of the fourth current to the integration capacitor modifying the voltage at the integration capacitor from the first charging voltage level to a second charging voltage level; and
determine whether a touch input to the touch sensor has occurred based on the second charging voltage level.

14. The device of claim 13, wherein the third current has an opposite polarity to a polarity of the first current with respect to the capacitance.

15. The device of claim 13, wherein the logic is further configured to:
interrupt the application of the second current when the voltage at the capacitance is substantially equal to a first voltage limit, the first voltage level limit is lower than the first pre-determined voltage level; and
interrupt the application of the fourth current when the voltage at the capacitance is substantially equal to a second voltage limit, the second voltage level limit is higher than a second pre-determined voltage level.

16. The device of claim 13, wherein the logic is further configured to:
discharge the capacitance of the touch sensor and apply the second current to the integration capacitor a pre-determined number of times.

17. The device of claim 13, wherein the application of the first current saturates the capacitance of the touch sensor and application of the second current results in the integration capacitor being below a capacitor saturation level.

* * * * *